(12) United States Patent
Sugiyama

(10) Patent No.: US 6,307,242 B1
(45) Date of Patent: Oct. 23, 2001

(54) SEMICONDUCTOR PHOTO-DETECTOR WITH SQUARE-SHAPED OPTICAL WAVE-GUIDE

(75) Inventor: Mitsuhiro Sugiyama, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/252,886

(22) Filed: Feb. 18, 1999

(30) Foreign Application Priority Data

Feb. 19, 1998 (JP) .................................................. 10-037363

(51) Int. Cl.[7] .................. H01L 31/0232; H01L 31/06; H01L 31/028
(52) U.S. Cl. .......................... 257/432; 257/188; 257/436; 257/465; 257/616
(58) Field of Search .................................. 257/184, 188, 257/432, 436, 461, 464–466, 616

(56) References Cited

U.S. PATENT DOCUMENTS 4,294,510 * 10/1981 Chappell ............................. 257/432
5,747,860 * 5/1998 Sugiyama et al. ................... 257/432
5,796,118 * 8/1998 Morikawa et al. ................... 257/436
5,999,675 * 12/1999 Sugiyama ............................. 257/432

FOREIGN PATENT DOCUMENTS

| 63-278280 | 11/1988 | (JP) . |
| 08-107232 | 4/1996 | (JP) . |
| 8-316449 | 11/1996 | (JP) . |
| 8-330671 | 12/1996 | (JP) . |
| 09-246588 | 9/1997 | (JP) . |
| 09-283786 | 10/1997 | (JP) . |

* cited by examiner

Primary Examiner—Gene M. Munson
(74) Attorney, Agent, or Firm—McGinn & Gibb, PLLC

(57) ABSTRACT

A semiconductor photo-detector, which has a high quantum efficiency due to high coupling with an incident beam and operates at higher frequency due to a reduced area of PN junction. In a semiconductor photo-detector of the present invention, reflection layers are deposited on both of the parallel surfaces of a square-shaped wave-guide, while light absorption layers are deposited on at least another pair of parallel surfaces which is one of the parallel pairs of remaining surfaces.

8 Claims, 5 Drawing Sheets

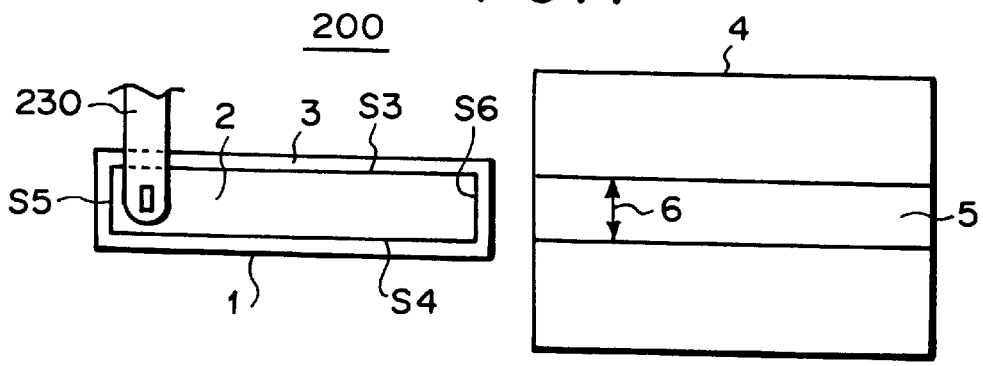
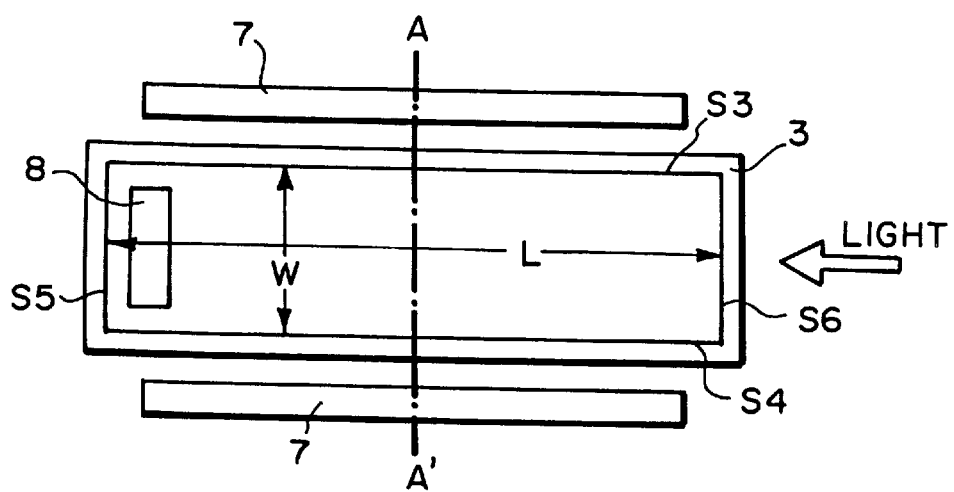
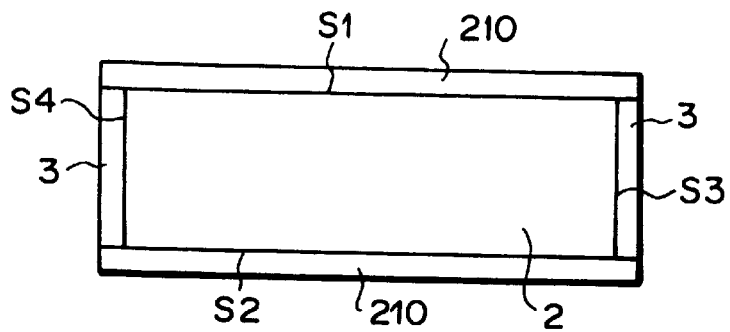

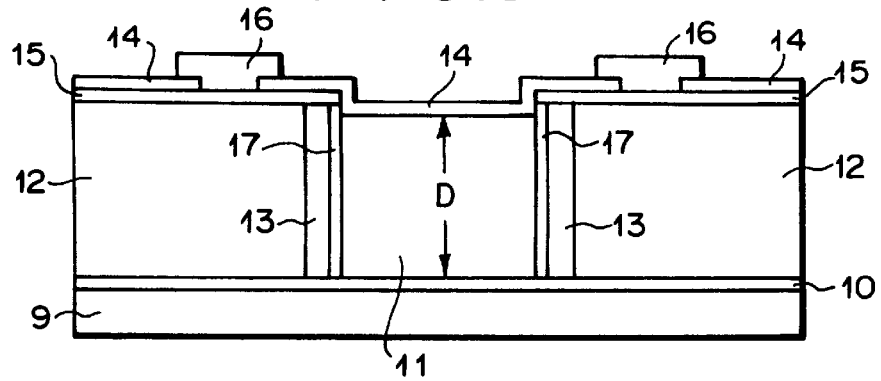
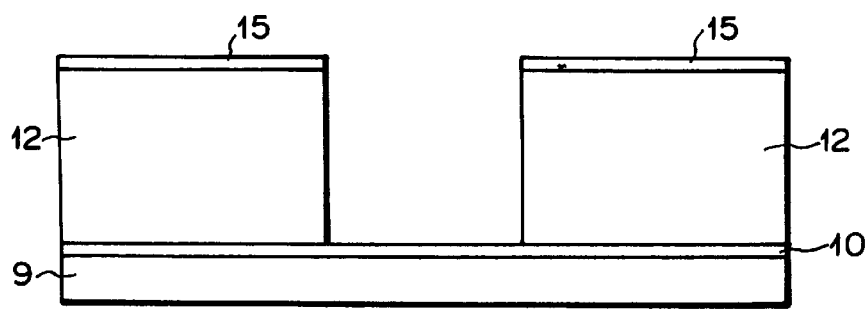
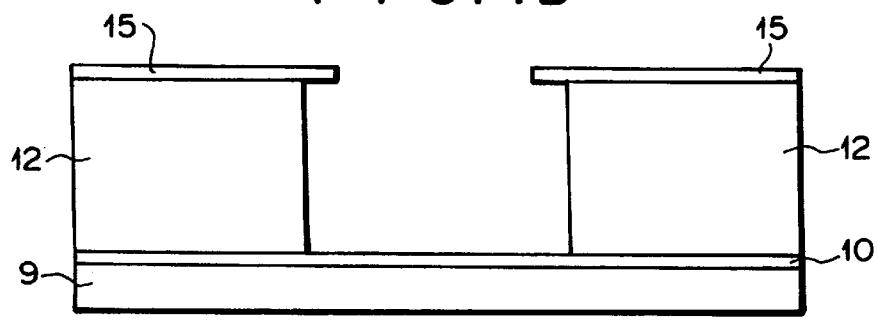
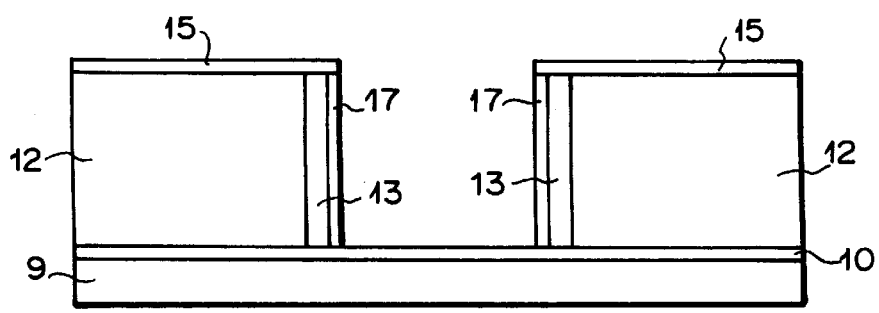

FIG. 6
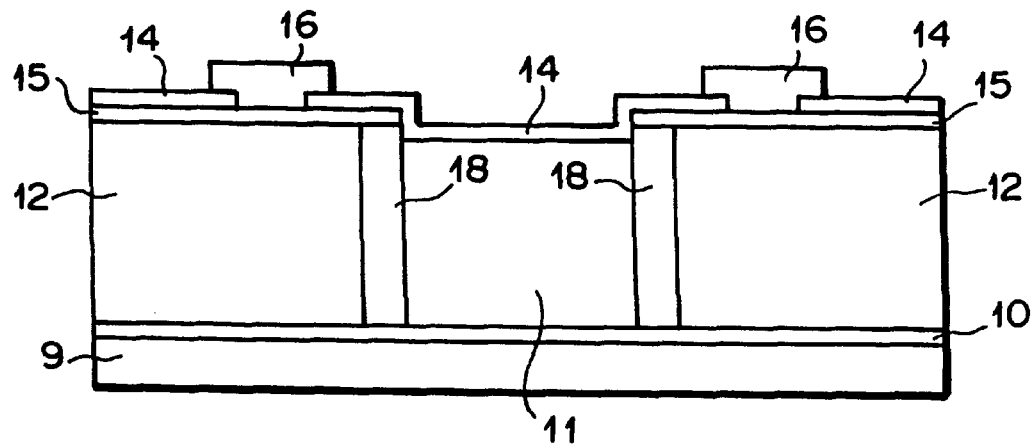
PRIOR ART FIG. 7A
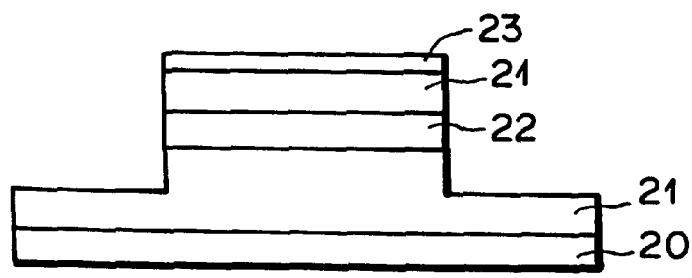
PRIOR ART FIG. 7B
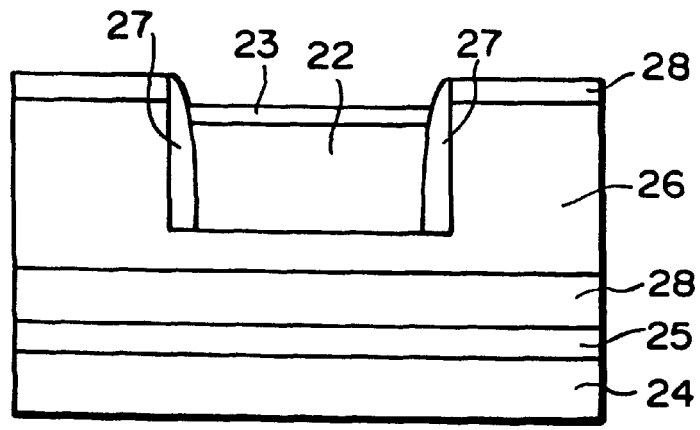

PRIOR ART F I G. 8
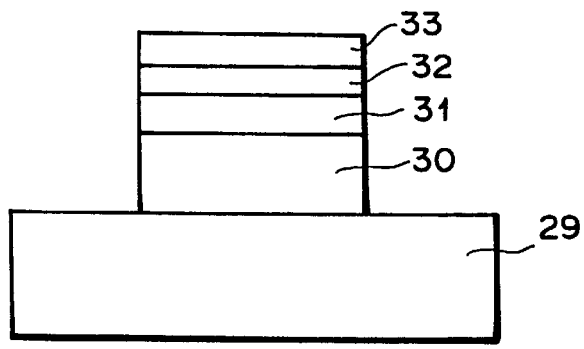
PRIOR ART F I G. 9
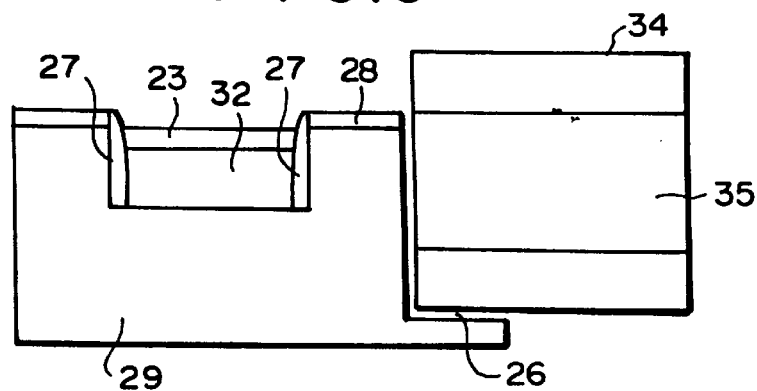
PRIOR ART F I G. 10
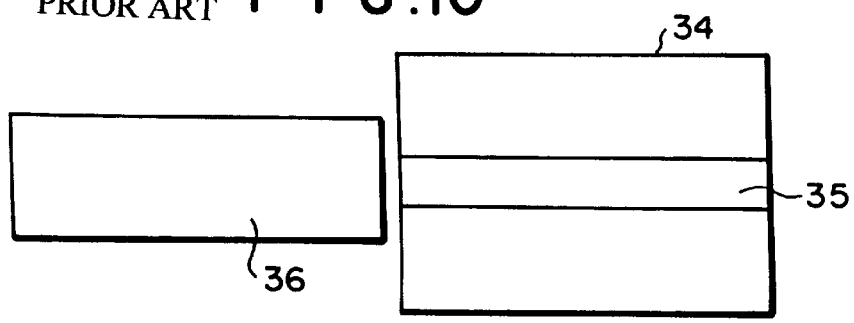
PRIOR ART F I G. 11
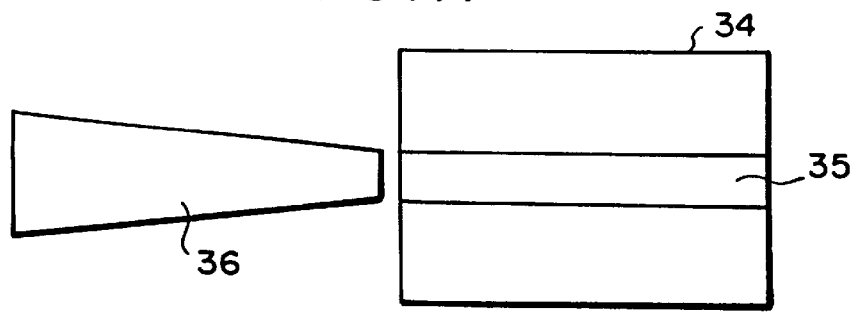

SEMICONDUCTOR PHOTO-DETECTOR WITH SQUARE-SHAPED OPTICAL WAVE-GUIDE

BACKGROUND OF THE INVENTION

1. Technical Field of the Invention

The present invention relates to a semiconductor photo-detector and its manufacturing method, and particularly, to a small-sized planar semiconductor photo-detector with high conversion efficiency.

2. Description of the Prior Art

Conventionally, light absorption materials for photo-diodes used in communication technologies are different depending upon wavelengths to be detected. In general, the narrower is the band gaps of the light absorption materials, the higher is the detection sensitivities. Accordingly, Si is used for the wavelength range below 1.0 μm, while Ge, or InGaAs is used for longer wavelength region over 1.0 μm.

The materials such as Ge for longer wavelength, in comparison with Si, are expensive, not easy in processing, and difficult to integrate it with other circuit elements. So, there have been expectations for a long time for photodiodes which are highly sensitive for longer wavelength and is produced by using Si processes which can save the production cost.

Further, the materials such as Ge crystal are hardly grown on a Si substrate, because their lattice constants are different from Si. Therefore, Ge can not be deposited directly on the Si substrate. Accordingly, a photodiode as disclosed in, for example, B. Jalali et al., Journal of Lightwave Technology, Vol. 12, June 1994 pp 930–935, includes light absorption layer 22 on Si substrate 20, as shown in FIG. 7A, wherein SiGe mixed crystal and Si are deposited alternatively.

Si single crystal layer 21 and P-type-silicon layer 23 are shown in FIG. 7A. The band gap in a Si photo detecting portion doped by Ge becomes narrower than that of Si.

Therefore, the photodetector as shown in FIG. 7A has some detection sensitivity in the longer wavelength, wherein Si and Si/Ge are deposited alternately to obtain a sufficiently thick SiGe film, because SiGe can not be deposited thick directly on the Si substrate, due to the differences of both lattice constants.

The inventors of the present invention discloses a planar SiGe photodiode, wherein the Si/SiGe layer is buried in a Si substrate, in JP 07-231113A (1995), and JP08-316449A (1996). Further, the fabrication result is reported in M. Sugiura at al., International Electron Device Meeting 1995 Technical Digest pp583–586.

FIG. 7B is a cross sectional view of the planar SiGe photodiode. As shown in FIG. 7B, Si/SiGe light absorption layer 22 is buried in a trench whose wall is covered by silicon dioxide 27. Here, the silicon dioxide wall is a mask used for a selective epitaxy for Si/SiGe. In FIG. 7B, there are shown Si dioxide film 25, N-buried layer 28, N-epitaxial layer 26, and P-type-Si layer.

Thus, Silicon Opto-Electric Integrated Circuit (Si-OEIC) for longer wavelength can be easily fabricated, because Si transister integrated circuit and photodiode can be formed on a single Si substrate. On the other hand, as shown in FIG. 8, a Ge crystalline light absorption layer on Si with an interface layer between Si and Ge is disclosed in JP 61-500466A (1986).

As shown in FIG. 8, SiGe layer 30 is deposited on Si substrate 29, wherein the Ge content is gradually increased to 100% at the top surface of the film. In FIG. 8, there are also shown N-type-Ge layer 31, Ge single crystal layer 32, and P-type-Ge layer 33.

Ge single crystal layer 32 can be grown, without depending upon the differences of lattice constants. Further, intermediate SiGe layer 30 can be deposited, because Ge content is gradually changed. Furthermore, as shown in FIG. 9, a method of direct Ge crystal growth on Si substrate and its application to photodiodes are disclosed in JP09-70933A (1997).

As shown in FIG. 9, an extremely thin Si or SiGe layer is grown on a thin Ge layer deposited on a Si substrate. Then, dislocations are localized in the interface between the two films to banish the dislocations from the Ge layer, by a thermal treatment. Therefore, Ge single crystal can be grown up to a desired thickness, owing to the lattice relaxation in the thermally treated thin Ge film.

As shown in FIG. 9, Ge single crystal layer 32 is grown directly on Si substrate 29 to fabricate a photodiode by selective epitaxy by using oxidized silicon as a mask. Further, there is shown in FIG. 9 a planar waveguide photodiode for longer wavelengths, wherein an optical fiber 34 is placed on groove 26 which is formed on Si substrate 29.

As shown in FIG. 10, photodiode 36 is made slightly wider than the core of optical fiber 34, taking the divergence of light beam into consideration in case of using a waveguide photodiode which accepts light beam in lateral direction as shown in FIG. 9.

However, as the width of photodiode 36 increases, the area of the PN junction increases, which results in a degradation in high frequency characteristics due to the increase in junction capacity. Therefore, a fan-shaped photodiode as shown in a plan view of FIG. 11 is disclosed in JP 08-316449A (1997), in order to suppress the junction capacity.

However, the junction capacity in the photodiode as shown in FIG. 11 is inevitably increased, although the junction area is suppressed in some degree without decreasing the quantum efficiency. On the other hand, when the width of a photodiode is not made wider, the coupling efficiency becomes lower, because the light beam diverges laterally, as shown in FIG. 10.

Any groove made by reflective material such as silicon dioxide in order to prevent the light beam from diverging can not be provided along the light path, because the lower electrode of the photodiode can not be extracted over the surface of the substrate. Therefore, the absorption efficiency for the diverging beam can not be maximized in the conventional semiconductor photo-detector, when its size is minimized.

Any technology for minimizing the size of photo-detector is not disclosed in JP 08-330671A (1996), although it is disclosed that a lateral width of an optical wave -guide is modulated.

SUMMARY OF THE INVENTION

Therefore, an object of the present invention is to reduce a leakage of the light beam which is incident to a photodiode and thereby to reduce an area of the PN junction in the photodiode, keeping the quantum efficiency (detection sensitivity) high. In other words, the present invention provides a semiconductor photo-detector with a high quantum efficiency whose characteristics do not degrade in a high frequency region.

According to the present invention, there is provide a semiconductor photo-detector, wherein reflection layers are deposited on both of the parallel surfaces of a square-shaped wave-guide, while light absorption layers are deposited on at least another pair of parallel surfaces which is one of the parallel pairs of remaining parallel surfaces of the waveguide.

There is also provided a manufacturing method of the above-mentioned photo-detector, which includes the following steps. In the first step, a first insulating film is deposited on a substrate, and a silicon film with a subscribed thickness is deposited on the insulating film. In the second step, a second insulating film is deposited on the silicon film, and then a prescribed region in the second insulation film is etched by photolithography. In the third step, a trench is formed by anisotropic dry etching by using the second insulating film as an etching mask. Here, the side wall of the trench is vertical to the substrate, and the bottom of the trench is the exposed surface of the first insulating film. In the forth step, the width of the trench is enlarged to a prescribed width by etching the side wall by isotropic dry etching or wet etching. Here, the first and second insulating films are left un-removed. In fifth step, a light absorption layer with a prescribed thickness is deposited on the side wall of the enlarged trench. In the sixth step, a silicon film is deposited on the light absorption layer. In the seventh step, the trench is buried by conductive silicon. In the eighth step, a third insulating film is deposited all over upon the second insulating film and the conductive silicon, and electrodes are formed on the prescribed position of the third insulating film.

According to the present invention, firstly, the quantum efficiency is improved. Further, secondly, the high frequency characteristics are improved, because the junction capacity is reduced. Concerning with the first effect of the present invention, there was some leakage of incident light outside the photodiode according to conventional technics, because the light beam from an optical fiber is divergent to a certain extent.

On the contrary, according to the present invention, the incident light is confined by upper and lower oxidized silicon films and the light absorption layer at the side wall. Thus, the quantum efficiency is improved. Concerning, the second effect, there was an inevitable increase in the junction capacity of the photodiode due to the enlargement of the width of the photodiode, in order to prevent a declination of the quantum efficiency. For example, a light beam from a single mode optical fiber with about 10 $\mu$m diameter core is assumed to be incident into a photodiode with its width W, its length L, its area S. Conventionally, W is 20 to 50 $\mu$m, and L is 200 $\mu$m, typically. Therefore, S is 400 to 10000 $\mu$m squared.

On the contrary, according to the present invention, two photo-diodes at both side walls with 10 $\mu$m W and 100 $\mu$m L are formed. Therefore, the total area S is 2000 $\mu$m squared. Here, the width W of the photodiode of the present invention is a depth of the trench. Thus, the junction area becomes smaller than a half of that of the conventional photodiode, because L can be reduced to a half of the conventional value due to the existance of the light absorption layers at both side of the optical wave-guide. Accordingly, the photo-detector of the semiconductor of the present invention operates at higher frequency.

BRIEF EXPLANATION OF THE DRAWINGS

FIG. 1 is a plan view of an exemplary embodiment of the present invention.

FIG. 2A is an enlarged plan view of a semiconductor photo-detector of the present invention.

FIG. 2B is an cross sectional view along A–A' line.

FIG. 3 is an enlarged cross sectional view along A–A' line.

FIGS. 4A, 4B, and 4C are cross sectional views for explaining manufacturing steps of a semiconductor photo-detector of the present invention.

FIG. 6 is a cross sectional view of another exemplary embodiment of the semiconductor photo-detector of the present invention.

FIG. 7A is a plan view of an exemplary embodiment of one of the conventional semiconductor photo-detector.

FIG. 7B is a cross sectional view of an exemplary embodiment of one of the conventional semiconductor photo-detector.

FIG. 8 is a cross sectional view of an exemplary embodiment of another conventional semiconductor photo-detector.

FIG. 9 is a cross sectional view of an exemplary embodiment of still another conventional semiconductor photo-detector.

FIG. 10 is a cross sectional view of an exemplary embodiment of still-more another conventional semiconductor photo-detector.

FIG. 11 is a cross sectional view of an exemplary embodiment of further still-more another conventional semiconductor photo-detector.

PREFERRED EMBODIMENT OF THE INVENTION

Figure 5A:
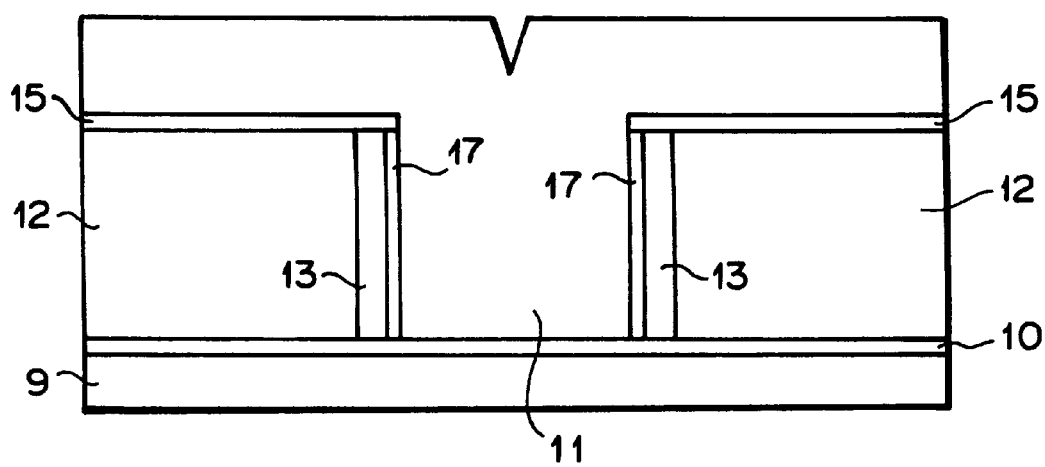
FIGS. 5A, 5B, and 5C are cross sectional views for explaining other manufacturing steps of a semiconductor photo-detector of the present invention.

According to the semiconductor detector and its manufacturing method of the present invention, the light absorption layer of wave-guide photo detector 1 is formed not on the upper part of the wave-guide, but on the side walls of the wave-guide. As shown in FIG. 1, there is formed a Si/SiGe layer, or a Ge layer as light absorption layer 3 on both of the walls of optical wave-guide 1 whose width is approximately equals to the core width 6 of an optical fiber, whereby a leakage of the light beam which is incident to a photo-diode is reduced, thereby an area of the PN junction in the photodiode is reduced, and the quantum efficiency (detection sensitivity) is kept high. In other words, the present invention provides a semiconductor photo detector with a high quantum efficiency whose characteristics do not degrade in a high frequency region.

An example of a semiconductor photo-detector and its manufacturing method of the present invention is explained, referring to the drawings. FIGS. 1 and 2A are plan views of an exemplary structure of semiconductor photo-detector 200 of the present invention. FIG. 2B is a cross sectional view along A–A' as shown in FIG. 2A. In a semiconductor photo-detector 200 of the present invention, reflection layers 210 are deposited on both of the parallel surfaces S1 and S2 of a square-shaped wave-guide 1, while light absorption layers 3 are deposited on at least another pair of parallel surfaces S3 and S4 which is one of the parallel pairs of remaining surfaces Z (S3,S4,S5,S6).

Light absorption layer 3 may also be formed on another pair of parallel planes S5 and S6. Here, the parallel planes S1 and S2 are the upper and lower surface of the optical wave-guide 1.

The parallel planes S3 and S4 are right and left side surfaces of the optical wave-guide 1.

Electrodes is formed at a part of light absorption layer 3 near the plane S5 which is parallel to light receiving plane S6. Electrodes may comprises wire 230 such as aluminum wire, and contact hole 220.

Light reflection layer 210 may be an oxidized silicon film. Further, light absorption layer 3 may be a Ge film, a SiGe film, or multi-layered film by Si and SiGe.

Further, optical wave-guide 1 may be planar-integrated in semiconductor photo-detector 200, although the wave-guide structure is not limited to the planar type. In the following, the structure of the semiconductor photo-detector 200 of the present invention is explained concretely.

FIG. 2A is a plan view of semiconductor photo-detector 200 of the present invention. FIG. 2B is a cross sectional view of semiconductor 200. FIG. 3 is a cross sectional view of semiconductor 200 along A–A' as shown in FIG. 2A. The incident direction of light is shown by an arrow in FIG. 2A, and is normal to the paper plane.

Optical wave-guide 1 is about 10 $\mu$m in width W, and about 100 $\mu$m in length L in FIG. 2. Its depth D is about 10 $\mu$m as shown in FIG. 3. Incident plane 11 made of P+ poly-silicon of wave-guide 1 is an anode electrode of the photodiode whose side wall contacts itself with P+ Si layer 17 in contact with about 1 $\mu$m thick Ge light absorption layer 13 in contact with is N-type-Si layer 12.

Further, about 0.5 $\mu$m thick oxidized silicon films 10 and 14 are deposited under and upon wave-guide 1.The refractive index of Si wave-guide 1 is 3.42, while the refractive index of oxidized silicon reflection layer 210 whose signature is 10 or 14 in FIG. 3 is 1.53 which is lower than that of optical wave-guide 1. Accordingly, incident light is in an evanescent coupling in wave-guide 1, wherein the incident light propagates in wave-guide 1, while it is reflected by oxidized silicon film 210 and is absorbed gradually by Ge light absorption layer 3 whose signature is 13 in FIG. 3.

The incident light is absorbed without causing any total reflection by light absorption layer 3, because the refractive index of Ge is about 4.09. The incident light was leaked toward the side directions in conventional photo-detector, although the incident light could be absorbed gradually by a light absorption layer deposited on the upper part of a wave-guide. On the contrary, in the present invention, the leakage of the incident light is prevented by light absorption layer 3 at the side wall and by upper and lower oxidized silicon film 210 of optical wave-guide 1.

The incident light whose wavelength is longer than 1.0 $\mu$m is not absorbed in optical wave-guide 1, because the light absorption by Si is almost zero. Further, 1 to 2 $\mu$m thickness of Ge layer is sufficient, because Ge absorbs through 3$\mu$m almost 100% of light energy whose wavelength is 1.3$\mu$m incident at a shallow angle under an evanescent coupling.

Next, a manufacturing method and the operation of the semiconductor photo-detector of the present invention are explained. FIGS. 4A, 4B, 4C, 5A, 5B, and 5C are cross sectional views for explaining the manufacturing steps. At first, A SOI (Silicon On Insulator) substrate is prepared, wherein about 10 $\mu$m thick N type Si layer is deposited on about 0.5 $\mu$m thick oxidized silicon film. Next, about 0.2 $\mu$m thick oxidized silicon film 15 is deposited on N type-Si layer 12, and then a region of about 6 $\mu$m×100 $\mu$m in the photo-diode region of about 10 $\mu$m×100 $\mu$m as shown in FIG. 2A is etched from oxidized silicon film 15 by photolithography to obtain an anode contact of the photo-diode.

Further, about 10 $\mu$m depth trench whose side wall is vertical is formed by anisotropic dry etching by using oxidized silicon film 15 as an etching mask. The surface of oxidized silicon 10 becomes exposed by the dry etching. Then, as shown in FIG. 4B, the side wall made of N type-Si 12 is etched to the same width 10 $\mu$m as the width of the photodiode region as shown in FIG. 2A by isotropic etching or wet etching.

Next, as shown in FIG. 4C, about 1 $\mu$m thick Ge layer 13 is grown on the side wall by an epitaxy such as UHV/CVD (Ultra High Vacuum/Chemical Vapor Deposition). Ge growth on Si as disclosed in JP09-070933A, 1997 as cited as one of the prior arts is preferably used to obtain an excellent crystalline Ge without any buffer layer between Ge and Si.

Figure 5B:
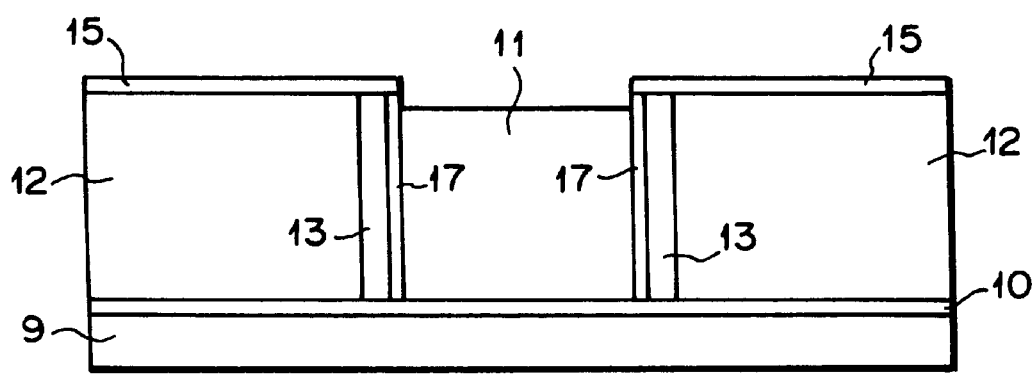

Then, about 0.2 $\mu$m thick P+ type-Si layer 17 is deposited on Ge layer 13 by the UHV/CVD as shown in FIG. 4C. Afterward, P+ type-poly-Si 11 is deposited by CVD to bury the trench, as shown in FIG. 5A. Further, the surface of P+ type-poly-Si 11 is polished or etch-backed by the dry etching to form a surface of an anode electrode under the surface of N type-Si layer 12., as shown in FIG. 5B.

Figure 5C:
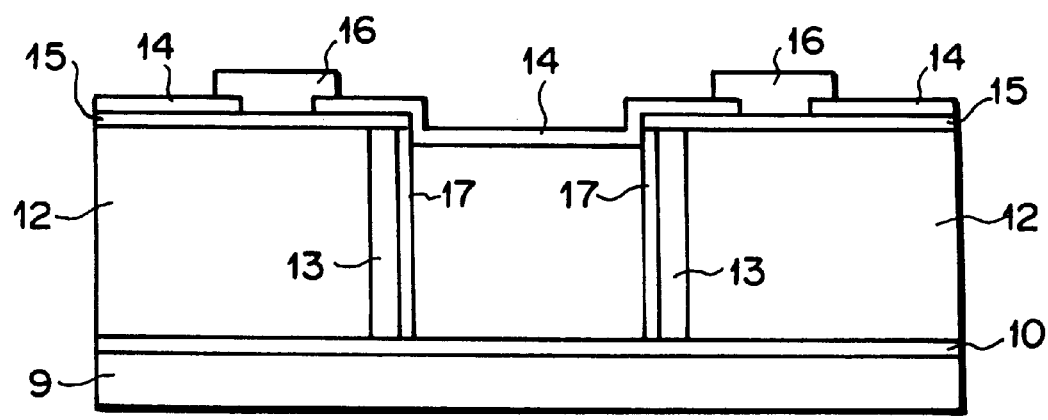

In general, trenches such as shown in FIG. 4C are easily buried, because a step coverage is excellent in poly-Si growth by CVD. Next, oxidized silicon film 14 is deposited all over the surface by CVD to form the contacts for cathode and anode electrodes. The photo-diode is completed by the selective deposition of aluminum electrode 16 on the anode and cathode electrodes, as shown in FIG. 5C. The anode electrode is not shown in FIG. 5C, because it does not exist in A–A' surface as shown in FIG. 2. Signal light is incident along the longitudinal direction of the photodiode, and propagates in the optical wave-guide of P+ type-poly-Si 11, and is absorbed gradually by Ge layer 13 at the side wall. On the other hand, when signal light is introduced along the lateral direction, optical fiber 34 is placed on groove 26 formed on Si substrate 29, as shown in FIG. 9.

The manufacturing method of the semiconductor photo-detector of the present invention includes the following steps. In the first step, a first insulating film is deposited on a substrate, and a silicon film with a subscribed thickness is deposited on the insulating film. In the second step, a second insulating film is deposited on the silicon film, and then a prescribed region in the second insulation film is etched by photolithography. In the third step, a trench is formed by anisotropic dry etching by using the second insulating film as an etching mask. Here, the side wall of the trench is vertical to the substrate, and the bottom of the trench is the exposed surface of the first insulating film. In the forth step, the width of the trench is enlarged to a prescribed width by etching the side wall by isotropic dry etching or wet etching. Here, the first and second insulating films are left un-removed. In fifth step, a light absorption layer with a prescribed thickness is deposited on the side wall of the enlarged trench. In the sixth step, a silicon film is deposited on the light absorption layer. In the seventh step, the trench is buried by conductive silicon. In the eighth step, a third insulating film is deposited all over upon the second insulating film and the conductive silicon, and electrodes are formed on the prescribed position of the third insulating film.

In place of Ge light absorption layer 13 as explained in an example of the present invention, a Si/SiGe multi-layered structure 18 may be adopted as shown in FIG. 6. Ge content in the SiGe mixed crystal layer is preferably 10 to 50%. A thickness ratio of the Si layer and the SiGe layer is varied, depending upon the Ge content. The crystal quality is excellent of the multi-layered structure is excellent, although its absorption coefficient in the long wavelength range is lower than that of Ge single layer. Therefore, the whole thickness of the multi-layered structure becomes greater than that of Ge single layer, for example, greater than 2 $\mu$m.

Several micrometer thickness is necessary for obtaining a sufficient sensitivity, according to a 20-layer structure by (Si 320 Å)/(SiGe 30 Å) reported in International Electron Devices Meeting (IEDM) Technical Digest pp 583–586, 1995 by M. Sugiyama (et al), who is the inventor of the present invention.

The whole thickness of the Si/SiGe multi-layer is determined by a given quantum efficiency, taking the absorption coefficient which is lower than that of 100% Ge. Si layers and SiGe layers are grown alternately as described in the above-mentioned IEDM Technical Digest 1995.

Although the present invention has been shown and described with respect to the best mode embodiment thereof, it should be understood by those skilled in the art that the foregoing and various other changes, omissions, and additions in the form and detail thereof may be made therein without departing from the spirit and scope of the present invention.

What is claimed is:

1. A semiconductor photo-detector which includes a square-shaped optical wave-guide, comprising:

reflection layers deposited on a pair of parallel surfaces of said square-shaped optical wave-guide; and absorption layers deposited on at least another pair of the parallel surfaces of said square-shaped optical wave-guide, wherein said parallel surfaces form a groove with a non-light-absorbing central portion.

2. The semiconductor photo-detector according to claim 1, wherein said absorption layers are deposited on every pair of the parallel surfaces of said square-shaped optical wave-guide, except the surfaces on which said reflection layers are deposited.

3. The semiconductor photo-detector according to claim 1, wherein said reflection layers are made of oxidized silicon.

4. The semiconductor photo-detector according to claim 1, wherein said absorption layers are Ge films, SiGe mixed crystal films, or Si/SiGe multi-layered films.

5. The semiconductor photo-detector according to claim 1, wherein said square-shaped wave-guide and a photo-detector are planar-integrated on a substrate.

6. A semiconductor photo-detector which includes a square-shaped optical wave-guide, comprising:

reflection layers deposited on a pair of parallel surfaces of said square-shaped wave-guide; and absorption layers deposited on at least another pair of the parallel surfaces of said square-shaped wave-guide, wherein said reflection layers are deposited on the upper surface and the lower surface of said wave-guide, when the longitudinal direction of said wave-guide is along the horizontal direction.

7. A semiconductor photo-detector which includes a square-shaped optical wave-guide comprising:

reflection layers deposited on a pair of parallel surfaces of said square-shaped wave-guide; and absorption layers deposited on at least another pair of the parallel surfaces of said square-shaped wave-guide;

wherein said absorption layers are deposited on the vertical surfaces of said wave-guide, when the longitudinal direction of said wave-guide is along the horizontal direction.

8. A semiconductor photo-detector which includes a square-shaped optical wave-guide, comprising:

reflection layers deposited on a pair of parallel surfaces of said square-shaped wave-guide;

absorption layers deposited on at least another pair of the parallel surfaces of said square-shaped wave-guide, and wherein electrodes are deposited on surfaces which are different from the surface which is an incident surface of a signal light beam, and wherein said electrodes are deposited on said reflection layers.

* * * * *